United States Patent
Yedur et al.

(10) Patent No.: US 6,197,455 B1
(45) Date of Patent: Mar. 6, 2001

(54) LITHOGRAPHIC MASK REPAIR USING A SCANNING TUNNELING MICROSCOPE

(75) Inventors: Sanjay K. Yedur; Bharath Rangarajan, both of Santa Clara; Bhanwar Singh, Morgan Hill; Michael K. Templeton, Atherton; Kathleen R. Early, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/231,679

(22) Filed: Jan. 14, 1999

(51) Int. Cl.[7] ....................................... G03F 9/00
(52) U.S. Cl. .................. 430/5; 430/322; 430/323; 430/324
(58) Field of Search ............. 430/5, 322, 323, 430/324; 250/492.22

(56) References Cited

U.S. PATENT DOCUMENTS

| | | | |
|---|---|---|---|
| 5,035,787 | 7/1991 | Parker et al. | 204/192.34 |
| 5,089,361 | 2/1992 | Huang | 430/5 |
| 5,129,132 | 7/1992 | Zdeblick et al. | 29/25.35 |
| 5,165,954 | 11/1992 | Parker et al. | 427/526 |
| 5,296,704 | 3/1994 | Mishima et al. | 250/306 |
| 5,343,042 | 8/1994 | Fuchs et al. | 250/307 |
| 5,506,080 | 4/1996 | Adair et al. | 430/5 |
| 5,548,117 | 8/1996 | Nakagawa | 250/423 |
| 5,618,760 | 4/1997 | Soh et al. | 437/228 |
| 5,702,849 | * 12/1997 | Sakata et al. | 430/5 |
| 5,865,978 | 2/1999 | Cohen | 205/118 |

FOREIGN PATENT DOCUMENTS 4-289861 * 10/1992 (JP) .

OTHER PUBLICATIONS

Regina Schmidt, Chris Spence, Luigi Capodieci, Zoran Krivokapic, Bernd Geh, Doris Flagello. "Impact of Coma on CD Control for Multiphase PSM Designs." Mar. 1998. SPIE vol. 3334. pp. 15–24.

* cited by examiner

*Primary Examiner*—S. Rosasco
(74) *Attorney, Agent, or Firm*—Renner, Otto, Boisselle & Sklar, LLP

(57) ABSTRACT

A method of repairing defects in a photomask used in the formation of a semiconductor wafer includes the use of a scanning tunneling microscope. The scanning tunneling microscope includes a very sharp tip having a diameter on the order of 100 Å or less. In order to remove excess material from a mask layer in the photomask, the tip is placed into contact with those regions having such excess material and the tip is used to scrape the excess material away. In order to add material to voids in a mask layer of the photomask, the tip is placed in proximity to those areas in need of the excess material and caused to deposit such material upon, for example, application of a bias voltage to the tip.

19 Claims, 6 Drawing Sheets

LITHOGRAPHIC MASK REPAIR USING A SCANNING TUNNELING MICROSCOPE

TECHNICAL FIELD

The present invention relates to photo-lithography and, more particularly, to a method of repair of semiconductor masks using a scanning tunneling microscope.

BACKGROUND OF THE INVENTION

In the semiconductor industry, there is a continuing trend toward producing semiconductor wafers having higher device densities. To achieve these high densities there has been and continues to be efforts toward scaling down the device dimensions in the wafers. In order to accomplish such high device packing density, smaller and smaller feature sizes are required. This may include the width and spacing of interconnecting lines and the surface geometry such as corners and edges of various features.

The requirement of small features with close spacing between adjacent features requires high resolution photo-lithographic processes. In general, lithography refers to processes for pattern transfer between various media. The basic lithography system consists of a light source, a photomask containing the pattern to be transferred to the wafer, a collection of lenses, and a means for aligning existing patterns on the wafer with patterns on the mask.

Conventional photomasks consist of chromium patterns on a glass or quartz plate which allow light to pass wherever the chromium is removed from the mask. In order to produce the photomask, a photoresist is initially formed above the chromium and patterned using known electron beam or laser beam techniques. Once the photoresist is patterned, the chromium layer is etched using a suitable etchant and the photoresist is then removed from the photomask.

Light of a specific wavelength is projected through the photomask onto a wafer coated with a resist, exposing the resist to the pattern formed on the photomask. In this manner the photomask can be used as a template for transferring the desired pattern onto multiple wafers. Exposing the resist on the wafer to light of the appropriate wavelength causes modifications in the molecular structure of the resist polymers which allows developer to dissolve and remove the resist in the exposed areas, presuming a positive resist is used. If a negative resist is used, the developer removes the resist in the unexposed areas.

Once the resist on the wafer has been developed, one or more etching steps take place which ultimately allow for transferring the desired pattern to the wafer. For example, in the event a hardmask is included below the resist on the wafer, a first etching step takes place in which the hardmask is etched to receive the pattern formed in the resist. In a subsequent etching step, the wafer is etched using the hardmask as a template for pattern transfer. The hardmask allows stronger etchants which are effective in etching the wafer to be used.

As the wafer feature size decreases, it becomes increasingly difficult to produce photomasks which can meet the accuracy demanded. If defects in the photomask are not accounted for, such defects are transferred to each wafer produced therewith, having a deleterious affect on the integrated circuits ultimately formed on such wafers. It becomes especially difficult to avoid defects from occurring in the photomask since such defects may cumulate from two different layers. For instance, any defect existing in the photoresist prior to etching of the chromium will be transferred to the chromium and also any additional defects which may exist in the chromium will exist as part of the photomask. Defects on these mask layers commonly arise from very small particles of foreign material, bubbles in the photoresist, or other flaws introduced during the pattern generation process. Additionally, such defects may result from subsequent handling following pattern formation.

To correct for such errors in the photomask, elaborate and expensive photomask inspections and processes for repair of mask layers have been developed. For instance, procedures for removing a defective mask layer and replacing it with a new mask layer have been used. Unfortunately, such procedures are time consuming and there is no way to guarantee that the newly formed mask will not again face similar problems.

It is also known to use ion beam sputtering or laser beam ablation to remove unwanted mask layer material from those areas of the photomask which were intended to be fully transmissive. Similarly, these techniques are also used for the deposition of additional, suitably opaque, material in those areas intended to be opaque. Unfortunately, these repair techniques typically yield either unacceptable results, or introduce undesirable phase or transmission defects in the final photomask. For instance, when attempting to repair an organic based resist material with an ion beam, typically there is produced a substantial amount of heat which deleteriously affects pattern repair abilities. An ion beam repair method is disclosed in U.S. Pat. No. 5,165,954 which is assigned to Microbeam, Inc.

Accordingly, there is a strong need in the art for a method of repairing lithographic photomasks which overcomes the drawbacks described above and others.

SUMMARY OF THE INVENTION

A method of repairing lithographic photomasks using a scanning tunneling microscope (STM) is provided. The STM includes a probe having a very sharp conductive tip with tip dimensions of 100 Å or less in diameter. Following the patterning of one or more mask layers, the tip of the STM is brought into proximity with any layer of the mask material at those areas in which defects exist. If the defect on the mask involves removal of mask material, then the tip of the STM is used to drag or scrape the excess mask material from the pattern. If, on the other hand, mask material is to be added to fill a pinhole, mouse bite, or the like, the tip of the p robe is caused to react with the surrounding air to produce mask material which is deposited at the location of the tip. For example, by placing the STM in an atmosphere controlled chamber where there is a partial pressure of reactive gases of between $10^{-2}$ to $10^{-5}$ torr, and applying a bias voltage to the tip, an oxidizing event is caused to occur which deposits mask material at the desired location.

By using an STM to correct defects in a photomask, very precise corrections can be made which allows for much higher pattern resolution than is conventionally available. For instance, using an STM, defects on the order of approximately 10 Å or greater in size can be corrected. Additionally, unlike repairs using ion or laser beam techniques, STM does not cause excessive heating to occur when repairing organic material such as resist. Thus, repairs can be made more accurately. Still further, the use of an STM to correct defects does not require the removal and replacement of an entire mask layer thereby reducing the amount to time and processing steps needed to correct defects. For example, defects present in a photoresist layer may be passed to an underlying chrome layer, however the cumulation of errors from the photoresist and the chrome layers can be accounted for by repairing the patterned chrome layer.

Thus, according to one aspect of the present invention, a method of repairing defects in at least one mask layer of a photomask is provided. The method includes the steps of forming the at least one mask layer above a light transmissive plate, and repairing defects in the at least one mask layer using a scanning tunneling microscope.

In accordance with another aspect of the present invention, a method of adding mask material to a mask layer formed above a light transmissive plate is provided. The method includes the steps of providing a tip of a scanning tunneling microscope proximate an area in which the mask material is to be added, and causing a chemical reaction to occur between the tip and air surrounding the tip such that the mask material is deposited on the area.

In accordance with yet another aspect of the present invention, a method of removing excess mask material from a mask layer formed above a light transmissive plate is provided. The method includes the steps of providing a tip of a scanning tunneling microscope into contact with at least a portion of the excess mask material to be removed, and removing the excess mask material with the tip.

To the accomplishment of the foregoing and related ends, the invention then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts.

Figure 1:
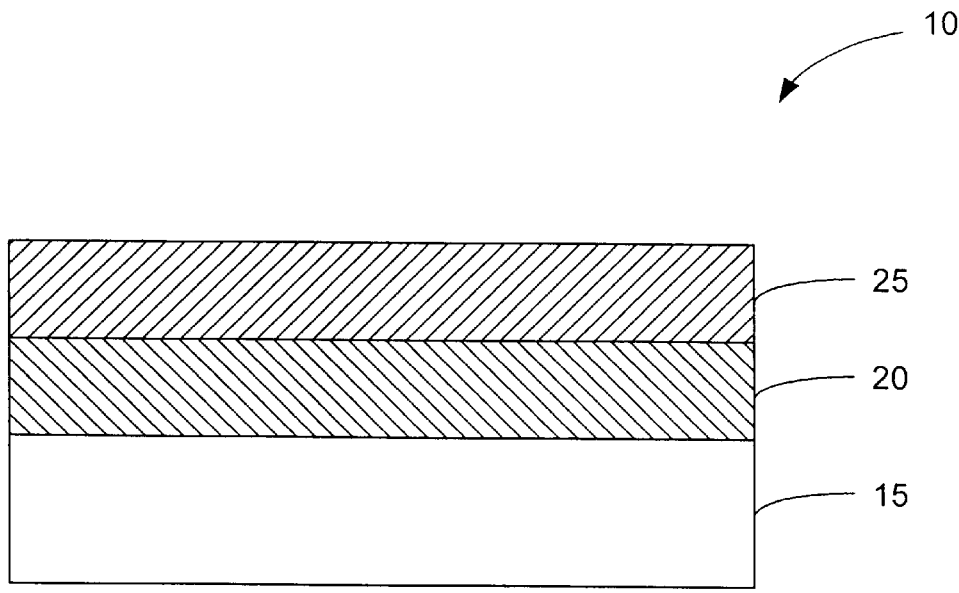
FIG. 1 illustrates a partial cross-sectional view of a photomask having an un-patterned resist layer formed thereon according to the present invention.

Referring initially to FIG. 1, there is depicted a cross-sectional view of a photomask 10 prior to patterning and etching. As is conventional, the photomask 10 is used as a template for transferring a desired pattern to multiple wafers (not shown) and in the present embodiment is used as part of a projection type lithographic process. At this stage in the manufacturing cycle, the photomask 10 is shown to include a transparent plate 15 (hereinafter "plate 15"), a metal film layer 20 (hereinafter "film 20") and, a photo-resist layer 25 (hereinafter "resist 25").

The plate 15 may be made of conventional photomask materials such as glass, quartz, etc. which are transmissive to light. The film 20 is formed over the plate 15 and will be etched in accordance with the pattern formed in the resist 25. As the film 20 is more resistant to damage than the resist 25, the film 20 is used as a final mask layer for defining the light pattern to be transferred through the plate 15 to the wafer (not shown). The film 20 may, for example, be made of chromium metal, chromium oxide, or the like. The resist 25 is formed over the film 20 and is patterned using conventional electron beam or laser beam techniques. It will be appreciated that while the present embodiment depicts the photomask 10 to include three layers of materials at this stage in the development cycle, additional layers of materials which are conventionally known may also be included as part of the photomask 10.

Figure 2:
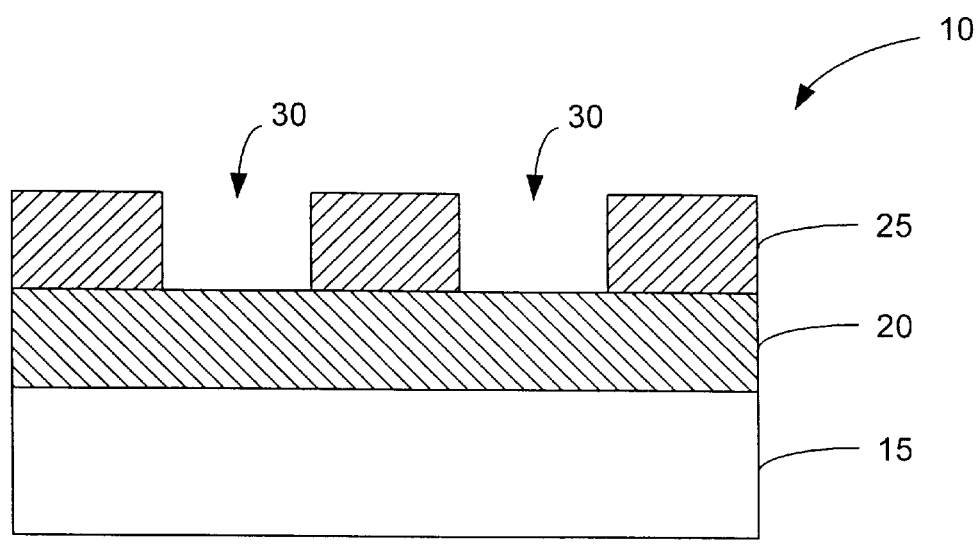
FIG. 2 illustrates a partial cross-sectional view of the photomask of FIG. 1 following resist patterning according to the present invention.

Referring now to FIG. 2, there is depicted a cross-sectional view of the photomask 10 following the resist patterning using the electron or laser beam techniques. As shown, following the resist patterning, the resist 25 includes regions 30 through which etching of film 20 can take place. During the resist patterning and later handling of the photomask 10, it is possible for defects to be introduced into the patterned resist 25. Such defects are highly undesirable as they will be transferred to the film 20 and ultimately to the resist formed above the wafer if not accounted for. Accordingly, the present invention provides a manner for correcting for such defects once such defects have been passed to the chrome layer or other existing conductive layer on the mask.

Figure 3:
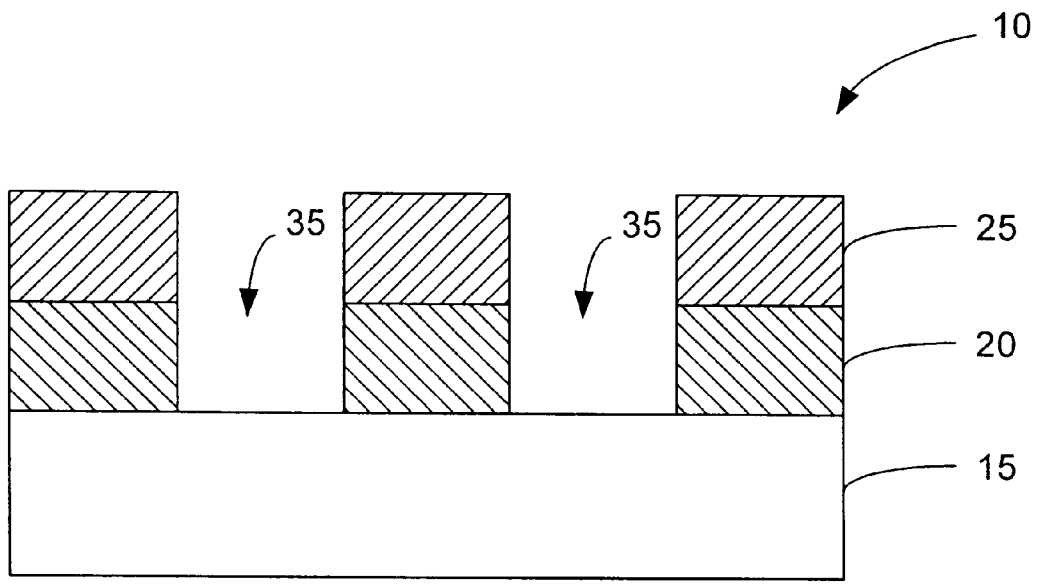
FIG. 3 illustrates a partial cross-sectional view of the photomask of FIG. 2 following etching of the chromium layer according to the present invention.

Referring now to FIG. 3, there is depicted a cross-sectional view of the photomask 10 following etching of the film 20 through the resist 25. As shown, the film 20 is patterned to include etched regions 35 through which light may be transferred to the wafer. During etching of the film 20, defects existing in the resist 25 are transferred to the film 20. Further, during the etching process and subsequent handling of the photomask 10, it is possible for additional defects to be introduced into the film 20.

Figure 4:
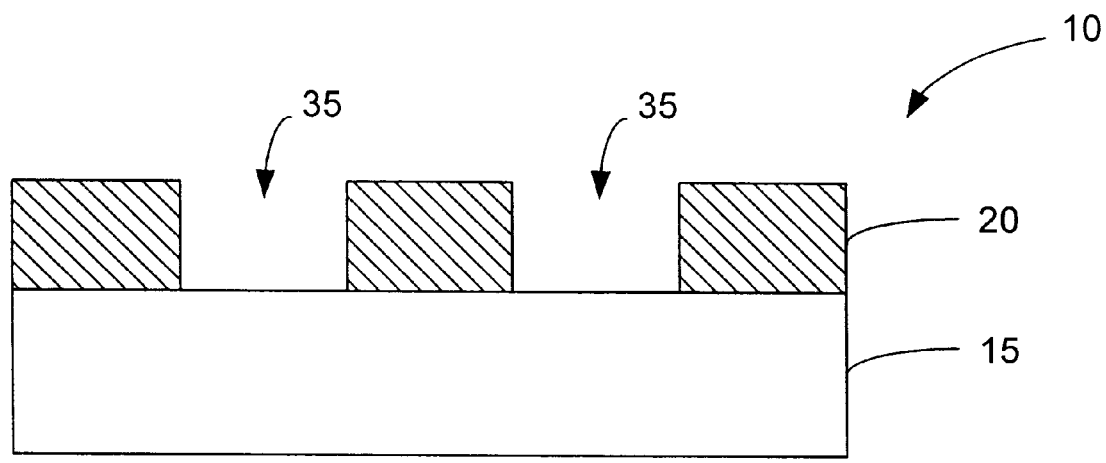
FIG. 4 illustrates a partial cross-sectional view of the photomask of FIG. 2 following removal of the resist layer according to the present invention.

Referring briefly to FIG. 4, the photomask 10 is shown following removal of the resist 25. Once the resist 25 has been removed, the scanning tunneling microscope may also be used to correct for defects in the film 20 prior to utilizing the photomask 10 as a template for wafer patterning. Accordingly, the present invention allows the scanning tunneling microscope to detect and repair defects in the mask layers prior to transferring a pattern to the wafer.

Figure 5:
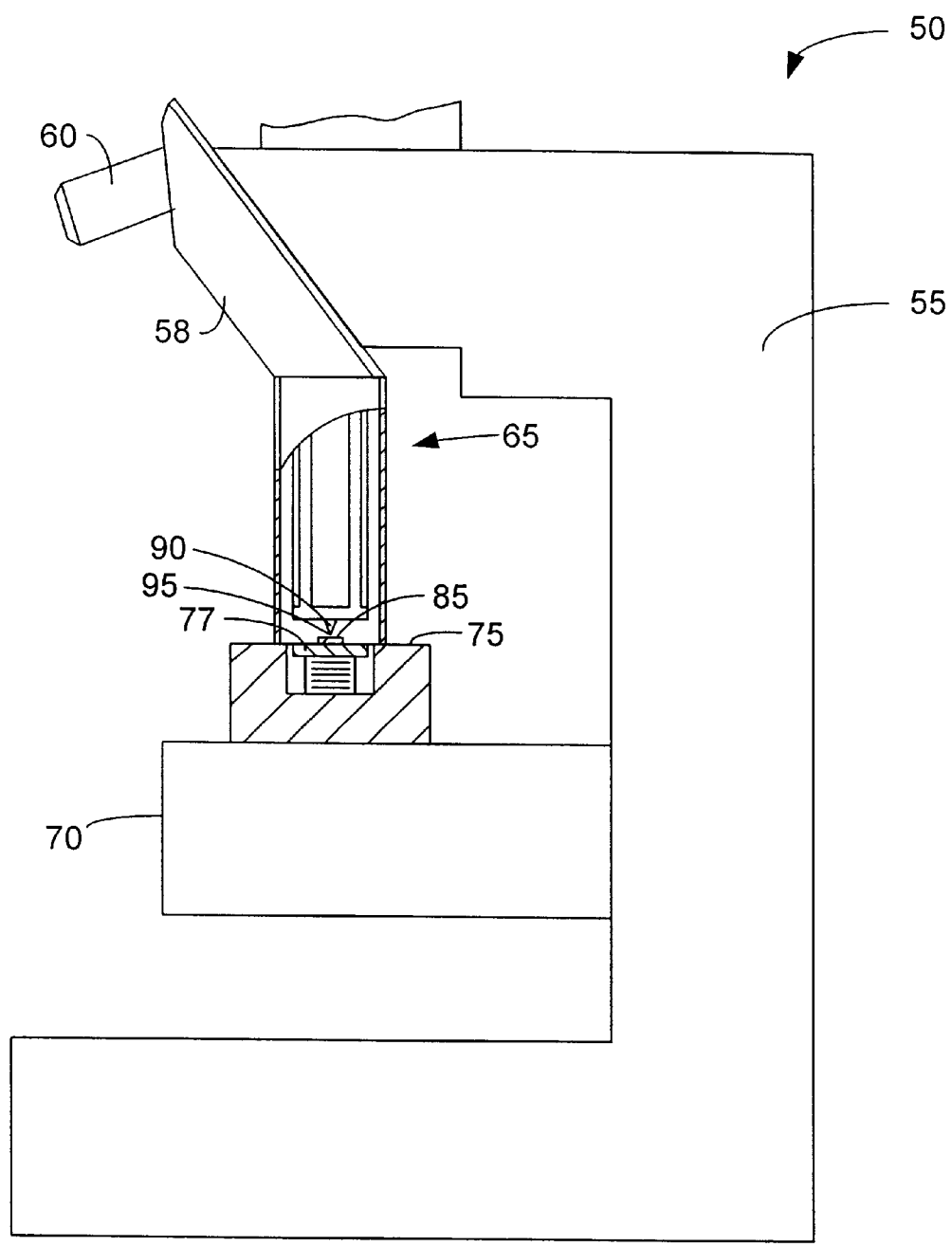
FIG. 5 is a side view of a scanning tunneling microscope used to repair photomasks according to the present invention.
Figure 6:
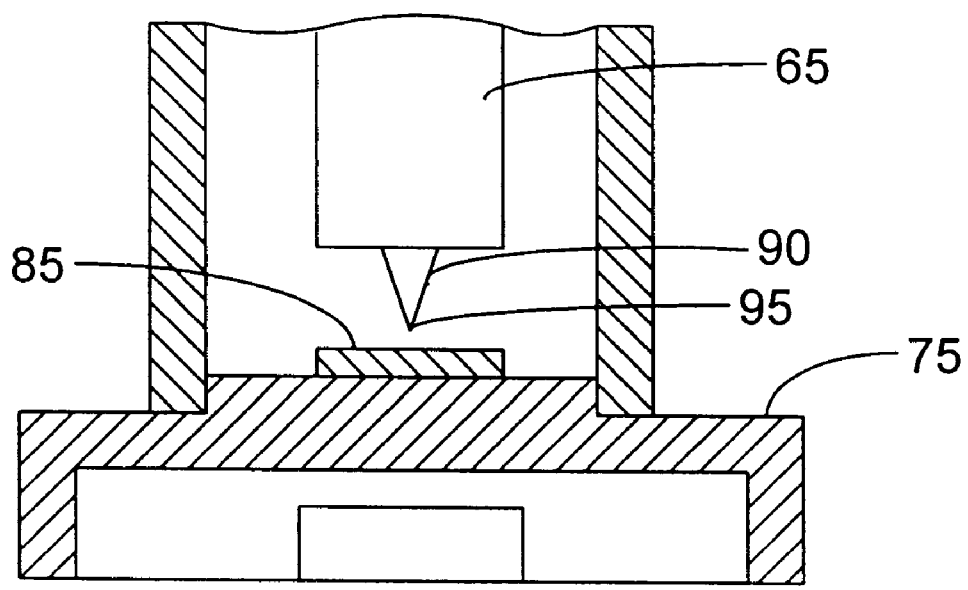
FIG. 6 is a partial cross-sectional view of a probe portion of the scanning tunneling microscope of FIG. 5.

Referring now to FIGS. 5 and 6, the scanning tunneling microscope 50 (hereinafter STM 50) according to one embodiment of the present invention is depicted. The STM 50 includes a microscope body 55 for supporting the various components of the STM 50. In particular, the body 55 supports a revolver 58 which rotatably supports an objective lens 60 and an STM unit 65. A movable elevation stage 70 is coupled to the body 55 and serves to support an object table 75. The object table 75 includes an object stage 77 upon which an object 85 such as the photomask 10 is placed.

The STM unit 50 includes a probe 90 having a sharp conical metal tip 95. The tip 95 may, for example, be made of silicon, silicon nitride, tungsten, carbon and/or other known materials, and has a tip diameter of less than 100 Å. The tip further includes circuitry for applying a bias voltage therein. Application of the bias voltage is used to sustain a tunneling current with a surface of an object placed on the stage 70 in a conventional manner. The tunneling current is exponentially sensitive to the spacing between the tip 95 and the surface of the object 85 and thus provides a representation of spacing. As such, if the probe 90 is caused to scan the surface of the object 85, the surface configuration of the object 85 may be measured at an atomic level. For example, the probe 90 may be caused to scan the surface of the object 85, while the distance between the object 85 and the tip 95 is controlled to keep the tunnel current value constant. Then, by recording the movement of the tip 95, the surface configuration of the object 85 may be realized. Thus, the STM 50 may be used to scan the surface of the photomask 10 to detect defects which exist, for example, in the resist 25 and/or the film 20. An STM suitable for use in conjunction with the present embodiment is commercially available from Digital Instruments of Santa Barbra, Calif.

In addition to utilizing the STM 50 to map the surface configuration of the object 85 and to detect defects, the present invention also provides for the STM 50 to be used to correct defects in any conductive mask layers. In the event any conductive layer of the photomask 10 includes a mask layer having voids such as a mouse bite or other regions of missing mask material, the tip 95 is placed proximate the defective area and caused to deposit additional material to fill the void by, for example, causing an oxidizing event to occur. On the other hand, if the mask includes conductive or non-conductive areas of excess or unwanted material, the tip 95 may be contacted to these areas and caused to drag or scrape the excess material away. Because the tip 95 of the probe 90 is extremely sharp and has a diameter of less than 100 Å, the preciseness and resolution with which the STM 50 is able to correct defects is substantially better than other conventionally known defect correction methods including ion and laser beam correction methods. Thus, defects in existing mask patterns can be corrected without affecting adjacent areas of the pattern.

In operation, defects in the photomask 10 at one or more points along the manufacturing cycle of the photomask 10 may be found and corrected using the STM 50. For instance, following patterning of the resist 25 as depicted in FIG. 2, the photomask 10 may be introduced to the STM 50 for defect discovery and repair prior to subsequent etching steps if, for example, the resist 25 is comprised of a conductive material. Additionally, following etching of the film 20 and removal of the resist 25 as shown in FIG. 4, the photomask 10 may again be introduced to the STM 50 for defect detection and repair. In this manner defects detected in the film 10 may be corrected prior to ultimately transferring the pattern to the wafer using projection lithography. The present embodiment discloses detecting and repairing defects in any conductive mask layers. Additionally, the STM 50 could be used to scan and/or repair defects in any layer at multiple stages throughout the manufacturing cycle of the photomask 10.

Figure 7:
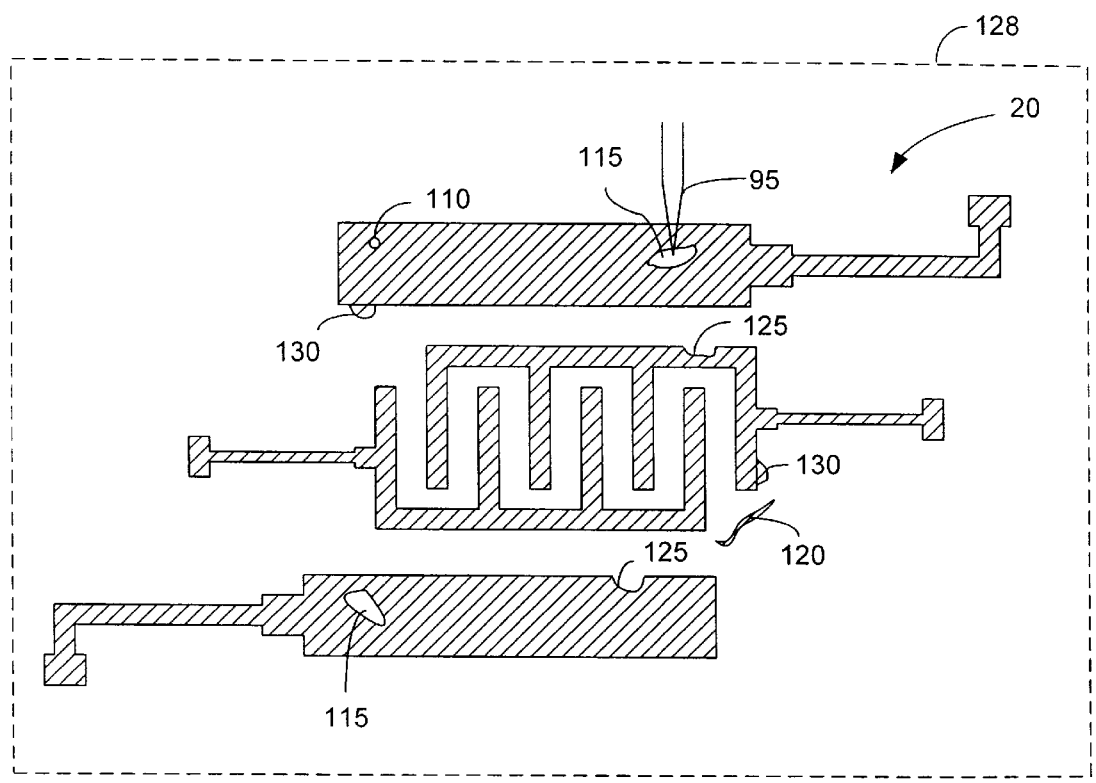
FIG. 7 is a top view of an exemplary defective mask prior to repair by the scanning tunneling microscope according the present invention.

Referring now to FIG. 7, a top view of a portion of the film 20 is shown following patterning thereof. As can be seen, the film 20 includes several defects which may have occurred during the transference of the resist pattern to the film 20, from subsequent handling of the photomask 10 (FIG. 2) upon which the film 20 is formed, or the like. In the present example, the defects are shown to include voids such as a pin hole 110, large holes 115, and mouse bites 125 and excess material such as contamination 120 and protruding portions 130.

In order to correct for such defects, following chrome patterning (FIG. 4), the photomask 10 is introduced onto object stage 77 (FIG. 5) of the STM 50. The STM 50 may either have preloaded into memory information regarding the known location of the defects on the photomask, or may electronically retrieve this information from a central database. For example, the locations of the defects may have been predetermined using a conventional scanning electronic microscope of other optical technique for defect inspection. Once the defects have been found, the locations of the defects may be electronically stored in the central database for retrieval by the STM 50 or in some other manner passed along to the STM. Upon receiving the information related to the known location of each defect, the STM 50 continues to repair the defects in accordance with the teachings herein.

Once defects have been located, the STM 50 is used to directly repair the film 20. In particular, in each area in which excess chrome material needs to be removed, the tip 95 of the probe 90 is placed thereon and caused to scrape and/or drag the excess material from the resist. For example, the film 20 depicted in FIG. 7 is shown to have excess material located at the protruding portions 130 and at the contamination 120. In order to remove the excess material, the tip 95 is placed into contact with a surface of the film 20 adjacent an area with excess material. Placement of the tip 95 to the appropriate location is controlled using conventional STM 50 position control techniques and therefore further discussion thereof is omitted for sake of brevity. Once placed thereon, the tip 95 is moved up, down, or side to side so as to remove the excess material from the film 20. During removal of the chrome, either a low bias voltage or no bias voltage is applied to the tip 95 so as to avoid accidentally depositing material on the film 20. If a bias voltage on the order of between 5 and 1000 volts is applied, the tip may be caused to attract the excess material thereby aiding in removal thereof.

Because the tip 95 of the probe 90 is very sharp, the STM 50 can be used to very accurately remove excess material from the film 20 without affecting adjacent areas.

The tip 95 is also used to deposit material in those areas in which voids exist. For example, as shown in FIG. 7, the pin hole 110, large holes 115 and mouse bites 125 each need mask material to be added. In order to deposit an appropriate mask material at these locations so as to fill any holes or gaps, the tip 95 is placed proximate the areas having voids and deposition of mask material is caused to occur. The tip 95 is, for example, placed within 20–30 Å of the surface. In order to deposit mask material, the tip 25 is caused to oxidize with certain molecules in the surrounding air so as to deposit an appropriate mask material at the location of the tip 95. Oxidization is caused to occur by applying an appropriate bias voltage to the tip 95 near the conductive layer being repaired at the time a deposition is desired. For example, in the present embodiment a bias voltage on the order of between 5 and 1000 volts is applied. Depending on the material of the tip 95 and concentration of reactive molecules in the surrounding chamber, the resulting material to be deposited can be controlled. For example, in the present embodiment, in order to obtain a suitable opaque material which is compatible with the chrome, the metal tip 95 and carbon molecules in the controlled chamber are caused to react with reactive gases to deposit suitable material for repairing the defect. For example, the deposited material may be carbon, chrome, or an amorphous silicon. As a result, the pin hole 110 is filled with a material compatible with the film 20. Further, the large holes 115 and mouse bites 125 are similarly filled.

In order to more effectively fill those areas of the film 20 having voids, it is also preferable to perform the filling procedure in a controlled chamber 128 where there is a high concentration of reactive gas which will oxidize with the tip 95 to form the desired material to be deposited. For example, in order to form the material compatible with the film 20, the STM and photomask 10 are included in a chamber 128 in which there is a predetermined concentration of carbon atoms. Such carbon atoms react with the tungsten tip 95 upon application of the bias voltage to the tip 95 to produce opaque mask material to fill the voids in the film 20.

Figure 8:
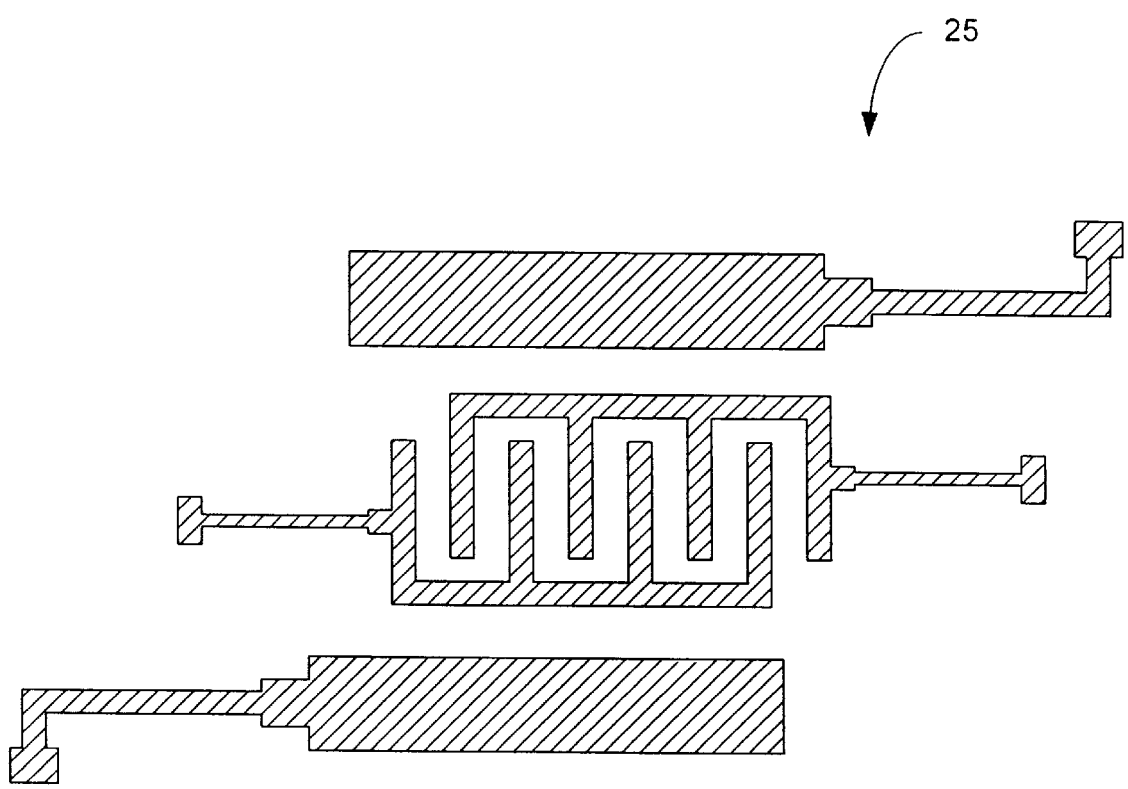
FIG. 8 is a top view of the mask of FIG. 7 following repair by the scanning tunneling microscope according to the present invention.

Once all of the excess material is removed and all of the voids are filled, the film 20 is repaired as depicted in FIG. 8.

The filling of voids such as pin holes and mouse bites in any other conductive layer occur similar to that described above except that the tip 95 of the probe 90 is caused to oxidize with a different material so as to deposit a material which is compatible with the other conductive layer. In this manner, application of the bias voltage to the tip 95 causes the tip to deposit the desired material which is compatible with the conductive layer at hand for filling the voids needed to repair such a conducive layer.

It will be appreciated, that while the present embodiment has been described with respect to the tip 95 of the probe 90 of the STM 50 filling voids in a chrome film layer, the STM 50 could be used to repair defects in a variety of other materials. For example, the tip 95 could be used to repair any conductive material including, for example, a conductive resist. Thus, the present invention is not limited to using the STM 50 to repair only those layers of a photomask 10 discussed above in the exemplary embodiment, but may be used to repair any number of mask materials.

The invention has been described with reference to the preferred embodiments. Obviously, modifications and alterations will occur to others upon reading and understanding the preceding detailed description. For instance, while the embodiment described above referred to using a STM to repair a photomask, the STM could also be used to repair mask layers formed on the wafer itself. For instance, the STM could be used to repair a hardmask and/or conductive resist formed above the wafer. It is intended that the invention be construed as including all such modifications alterations, and equivalents thereof and is limited only by the scope of the following claims.

What is claimed is:

1. A method of repairing defects in at least one mask layer of a photomask, comprising the steps of:
    forming the at least one mask layer above a light transmissive plate; and
    repairing defects in the at least one mask layer using a scanning tunneling microscope having a tip portion,
    wherein the step of repairing defects includes at least one of
        removing excess material from the at least one mask layer by scraping or dragging the excess material with the tip portion, and
        causing the tip portion to chemically react with gas molecules to produce mask material to fill voids in the at least one mask layer.

2. The method of claim 1, wherein two mask layers are formed above the plate during the step of forming.

3. The method of claim 2, wherein one of the two mask layers is formed on the plate, and the one of the two mask layers comprises chromium.

4. The method of claim 1, wherein the plate comprises one of glass and quartz.

5. A method of repairing defects in at least one mask layer of a photomask, comprising the steps of:
    forming the at least one mask layer above a light transmissive plate; and
    repairing defects in the at least one mask layer using a scanning tunneling microscope,
    wherein the step of repairing defects includes at least one of
        removing excess material from the at least one mask layer by scraping or dragging, and
        causing a chemical reaction with gas molecules to fill voids in the at least one mask layer;
    wherein the scanning tunneling microscope includes a probe having a tip.

6. The method of claim 5, wherein voids in the at least one mask layer are filled by causing material to be deposited in the void via the tip.

7. The method of claim 6, wherein the excess material is removed from the mask layer by contacting the tip of the probe to the excess material and scraping the excess material away.

8. The method of claim 5, wherein in order to cause material to be deposited in the void, the scanning tunneling microscope and photomask are placed in an atmosphere controlled chamber.

9. The method of claim 8, wherein the material is deposited as a result of an oxidizing event which takes place between the tip and the gas molecules in the chamber when a bias voltage is applied to the tip.

10. The method of claim 9, wherein the bias voltage is between 5 and 1000 volts.

11. The method of claim 9, wherein the tip comprises one of silicon, silicon nitride, and tungsten.

12. A method of adding mask material to a mask layer formed above a light transmissive plate, comprising the steps of:
    providing a tip of a scanning tunneling microscope proximate an area in which the mask material is to be added; and
    causing a chemical reaction to occur between the tip and gas molecules surrounding the tip such that the mask material is deposited on the area.

13. The method of claim 12, wherein the step of causing a chemical reaction to occur includes applying a bias voltage to the tip.

14. The method of claim 12, further comprising the step of:
    prior to causing the chemical reaction to occur, placing the scanning tunneling microscope and the mask layer in a controlled chamber.

15. The method of claim 14, wherein the chamber includes reactive gas molecules which oxidize with the tip during application of the bias voltage to produce the mask material to be deposited.

16. A method of removing excess mask material from a mask layer formed above a light transmissive plate, comprising the steps of:
    providing a tip of a scanning tunneling microscope into contact with at least a portion of the excess mask material to be removed; and
    removing the excess mask material with the tip.

17. The method of claim 16, wherein the tip has a tip diameter of less than 100 A°.

18. The method of claim 17, wherein the tip is a conical tip and comprises one of silicon, silicon nitride, and tungsten.

19. The method of claim 16, wherein a low voltage bias of between 5 and 1000 volts is applied to the tip during the step of removing.

* * * * *